(12) United States Patent
Tateno et al.

(10) Patent No.: US 12,166,112 B2
(45) Date of Patent: Dec. 10, 2024

(54) THIN FILM TRANSISTOR INCLUDING A STACKED MULTILAYER GRAPHENE ACTIVE LAYER

(71) Applicant: SUMITOMO ELECTRIC INDUSTRIES, LTD., Osaka (JP)

(72) Inventors: Yasunori Tateno, Osaka (JP); Fuminori Mitsuhashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 351 days.

(21) Appl. No.: 17/398,649

(22) Filed: Aug. 10, 2021

(65) Prior Publication Data

US 2022/0059683 A1    Feb. 24, 2022

(30) Foreign Application Priority Data

Aug. 24, 2020 (JP) .................................. 2020-141018

(51) Int. Cl.
*H01L 29/16* (2006.01)
*H01L 21/02* (2006.01)
(Continued)

(52) U.S. Cl.
CPC .... *H01L 29/7606* (2013.01); *H01L 21/02378* (2013.01); *H01L 21/02444* (2013.01);
(Continued)

(58) Field of Classification Search
CPC ............. H01L 29/1606; H01L 29/4236; H01L 29/66045; H01L 29/78684; H01L 29/78697; H01L 29/78696; H01L 21/02378; H01L 21/02444; H01L 21/02527; H01L 29/78687
See application file for complete search history.

(56) References Cited

U.S. PATENT DOCUMENTS

2017/0301758 A1   10/2017   Okada et al.

FOREIGN PATENT DOCUMENTS

JP    2009094190 A  *  4/2009
JP    2009-182173 A     8/2009
(Continued)

OTHER PUBLICATIONS

Ryuta Yagi, et al., "Low-energy band structure and even-odd layer number effect in AB-stacked multilayer graphene," Science Report, vol. 8, Article No. 13018, Aug. 29, 2018.
(Continued)

*Primary Examiner* — Marcos D. Pizarro
(74) *Attorney, Agent, or Firm* — Volpe Koenig (57) ABSTRACT

A semiconductor device includes a graphene film disposed on a substrate and formed of atomic layers of graphene that are stacked, a source electrode and a drain electrode disposed on the graphene film, and a gate electrode disposed on the graphene film between the source electrode and the drain electrode with a gate insulator film interposed between the gate electrode and the graphene film, wherein a first number of the atomic layers of the graphene film in a source region where the source electrode is located and a drain region where the drain electrode is located is greater than a second number of the atomic layers of the graphene film in a channel region where the gate electrode is located.

8 Claims, 10 Drawing Sheets

(51) Int. Cl.
    *H01L 29/423*     (2006.01)
    *H01L 29/66*     (2006.01)
    *H01L 29/76*     (2006.01)
    *H01L 29/786*     (2006.01)

(52) U.S. Cl.
    CPC .... *H01L 21/02527* (2013.01); *H01L 29/1606* (2013.01); *H01L 29/4236* (2013.01); *H01L 29/66045* (2013.01); *H01L 29/78684* (2013.01); *H01L 29/78687* (2013.01); *H01L 29/78696* (2013.01)

(56) References Cited

FOREIGN PATENT DOCUMENTS

| | | | |
|---|---|---|---|
| JP | 2014203929 A | * | 10/2014 |
| JP | 2017-193157 A | | 10/2017 |

OTHER PUBLICATIONS

Japanese Office Action issued on Nov. 7, 2023 for Japanese Patent Application No. 2020-141018.

* cited by examiner

THIN FILM TRANSISTOR INCLUDING A STACKED MULTILAYER GRAPHENE ACTIVE LAYER

CROSS-REFERENCE TO RELATED APPLICATION

This application is based upon and claims the benefit of priority of the prior Japanese Patent Application No. 2020-141018, filed on Aug. 24, 2020, the entire contents of which are incorporated herein by reference.

BACKGROUND

(i) Technical Field

The present disclosure relates to a semiconductor device and a method of manufacturing the same, for example, a semiconductor device having a graphene film and a method of manufacturing the same.

(ii) Related Art

Graphene is a carbon material in which six-membered rings of carbon atoms are formed into a sheet. Transistors such as field effect transistors (FETs) in which graphene, which has high electron mobility, is used as a channel have been developed. It has been known to form a graphene film by forming a silicon carbide (SiC) film on a substrate and heat-treating the SiC film as disclosed in, for example, Japanese Patent Application Publication No. 2017-193157 (hereinafter, referred to as Patent Document 1). A band structure obtained when one or more layers of graphene are stacked has been known as disclosed in, for example, Scientific Reports vol. 8, Article number: 13018 (2018) (hereinafter, referred to as Non-Patent Document 1).

SUMMARY

In Patent Document 1, a source electrode and a drain electrode are disposed on a graphene film, and a gate electrode is disposed on the graphene film between the source electrode and the drain electrode with a gate insulator film interposed between the gate electrode and the graphene film. However, the contact resistance between the source electrode and the graphene film and the contact resistance between the drain electrode and the graphene film are high. Since the parasitic resistance is high as described above, the transistor characteristics such as cutoff frequency deteriorate.

An aspect of the present disclosure is a semiconductor device including: a graphene film disposed on a substrate and formed of atomic layers of graphene that are stacked; a source electrode and a drain electrode disposed on the graphene film; and a gate electrode disposed on the graphene film between the source electrode and the drain electrode with a gate insulator film interposed between the gate electrode and the graphene film, wherein a first number of the atomic layers of the graphene film in a source region where the source electrode is located and a drain region where the drain electrode is located is greater than a second number of the atomic layers of the graphene film in a channel region where the gate electrode is located.

Another aspect of the present disclosure is a method of manufacturing a semiconductor device, the method including: forming a first SiC film on a substrate; forming a first graphene film having an atomic layer of graphene from the first SiC film by heat-treating the first SiC film; forming a second SiC film in a part of a region on the first graphene film; forming a second graphene film having an atomic layer of graphene from the second SiC film by heat-treating the second SiC film; forming a gate electrode on the first graphene film in a region where the second graphene film is not formed with a gate insulator film interposed between the gate electrode and the first graphene film; and forming a source electrode and a drain electrode on the second graphene film at respective sides of the gate electrode.

DETAILED DESCRIPTION

[Description of Embodiments of the Present Disclosure]

First, details of embodiments of the present disclosure will be described as listed below.

An embodiment of the present disclosure is (1) a semiconductor device including: a graphene film disposed on a substrate and formed of atomic layers of graphene that are stacked; a source electrode and a drain electrode disposed on the graphene film; and a gate electrode disposed on the graphene film between the source electrode and the drain electrode with a gate insulator film interposed between the gate electrode and the graphene film, wherein a first number of the atomic layers of the graphene film in a source region where the source electrode is located and a drain region where the drain electrode is located is greater than a second number of the atomic layers of the graphene film in a channel region where the gate electrode is located.

(2) The first number of the atomic layers in the source region and the drain region is preferably ten or greater layers, and the second number of the atomic layers in the channel region is preferably two or less layers. This configuration further improves the characteristics of the semiconductor device.

(3) The first number of the atomic layers in the source region and the drain region is preferably 20 or less layers.

(4) The first number of the atomic layers in the source region and the drain region is preferably five or greater layers, and the second number of the atomic layers in the channel region is preferably two or less layers.

(5) A third number of the atomic layers in at least a first region, which is at the source region side, of a first access region between the source region and the channel region is preferably greater than the second number of the atomic layers in the channel region, and a fourth number of the atomic layers in at least a second region, which is at the drain region side, of a second access region between the drain region and the channel region is preferably greater than the second number of the atomic layers in the channel region. This configuration further improves the characteristics of the semiconductor device.

(6) The third number of the atomic layers in the first region is preferably ten or greater layers, and the fourth number of the atomic layers in the second region is preferably ten or greater layers.

(7) A fifth number of the atomic layers in a third region, which is a region other than the first region in the first access region, is preferably less than the third number of the atomic layers in the first region, and a sixth number of the atomic layers in a fourth region, which is a region other than the second region in the second access region, is preferably less than the fourth number of the atomic layers in the second region.

(8) A width of the third region in a direction from the source region to the drain region is preferably less than a width of the first region in the direction from the source region to the drain region, and a width of the fourth region in the direction from the source region to the drain region is preferably less than a width of the second region in the direction from the source region to the drain region.

(9) A width of each of the source region and the drain region in a first direction perpendicular to a second direction in which the source electrode and the drain electrode are arranged is preferably greater than a width of the channel region in the first direction. This configuration further improves the characteristics of the semiconductor device.

(10) Another embodiment of the present disclosure is a method of manufacturing a semiconductor device, the method including: forming a first SiC film on a substrate; forming a first graphene film having an atomic layer of graphene from the first SiC film by heat-treating the first SiC film; forming a second SiC film in a part of a region on the first graphene film; forming a second graphene film having an atomic layer of graphene from the second SiC film by heat-treating the second SiC film; forming a gate electrode on the first graphene film in a region where the second graphene film is not formed with a gate insulator film interposed between the gate electrode and the first graphene film; and forming a source electrode and a drain electrode on the second graphene film at respective sides of the gate electrode. This configuration further improves the characteristics of the semiconductor device.

[Details of Embodiments of the Present Disclosure]

The following describes specific examples of a semiconductor device in accordance with embodiments of the present disclosure with reference to drawings. It should be noted that the present invention is not limited to these examples but is shown by the claims, and it is intended that all modifications are included in the equivalents of the claims and the scope of the claims.

First Embodiment

Figure 1:
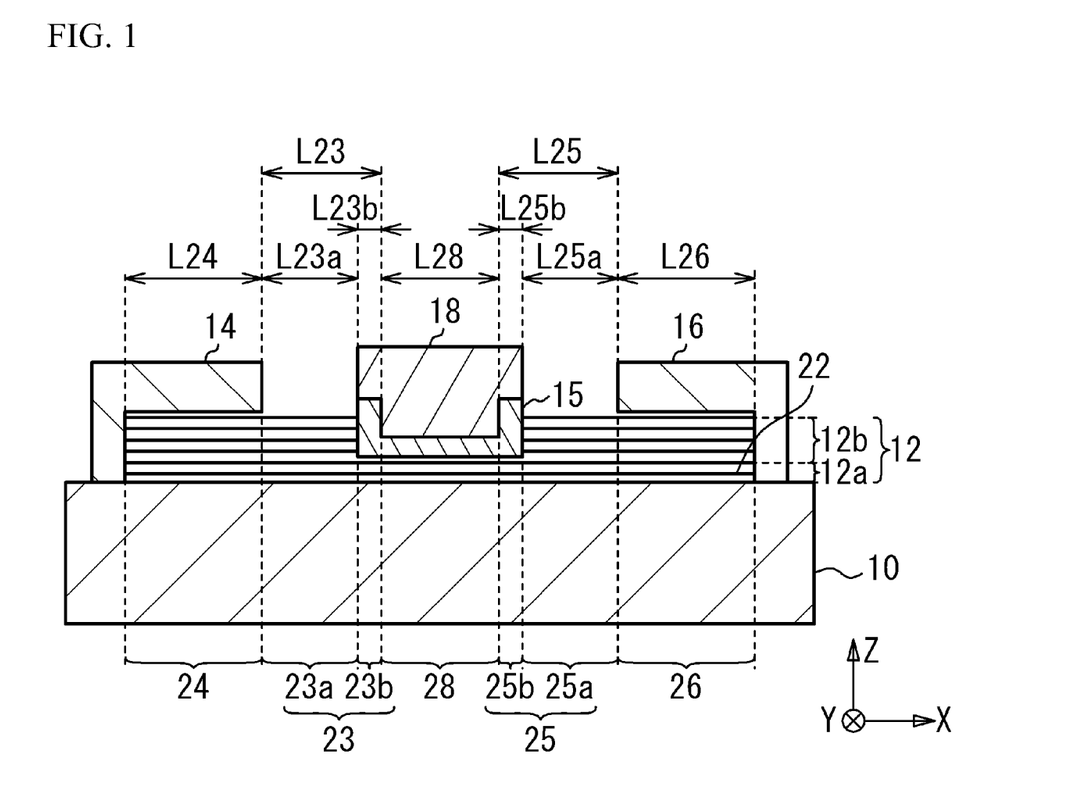
FIG. 1 is a cross-sectional view of a semiconductor device in accordance with a first embodiment.
Figure 2:
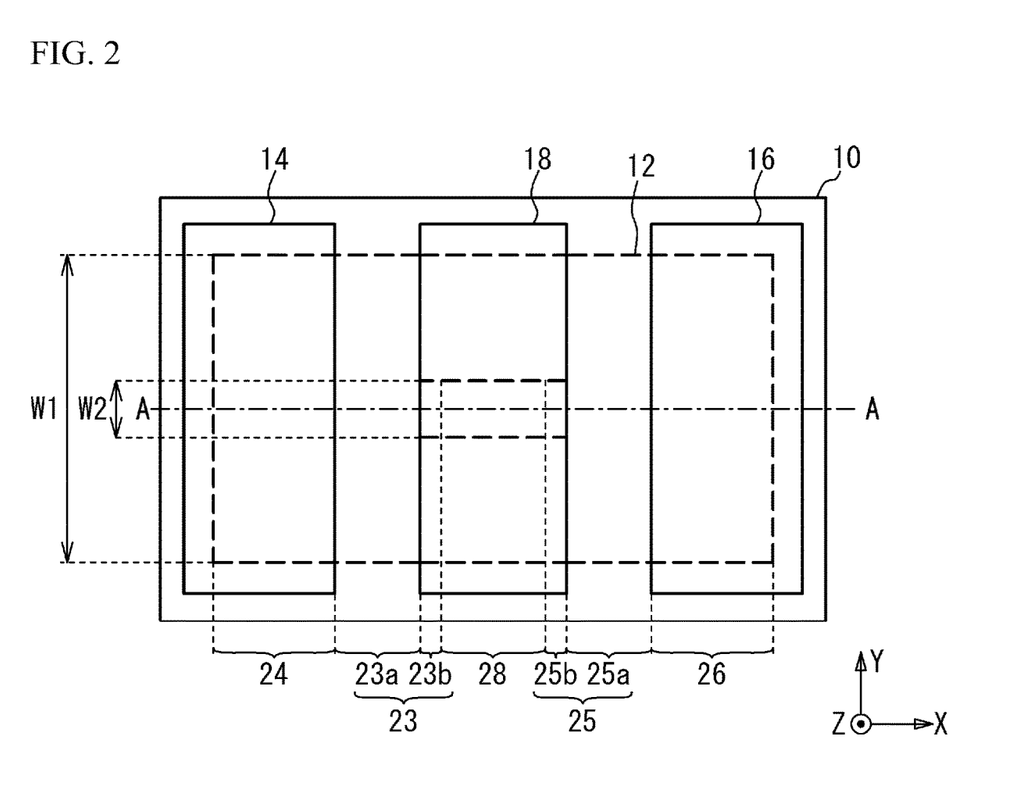
FIG. 2 is a plan view of a semiconductor device in accordance with the first embodiment.

FIG. 1 is a cross-sectional view of a semiconductor device in accordance with a first embodiment, and FIG. 2 is a plan view of a semiconductor device in accordance with the first embodiment. FIG. 1 corresponds to a cross-section taken along line A-A in FIG. 2. The normal direction of a substrate 10 is defined as a Z direction, a direction from a source electrode 14 to a drain electrode 16 (the propagation direction of carriers) among the planar directions of the substrate 10 is defined as an X direction, and a direction perpendicular to the X direction among the planar directions of the substrate 10 is defined as a Y direction. In FIG. 1, an atomic layer 22 made of graphene is indicated by a straight line extending in the X direction. The same applies to other drawings.

As illustrated in FIG. 1 and FIG. 2, a graphene film 12 formed of stacked atomic layers 22 of graphene is disposed on the substrate 10. The graphene film 12 in a region other than the active region is removed. The source electrode 14 and the drain electrode 16 are disposed on the graphene film 12. A gate electrode 18 is formed on the graphene film 12 between the source electrode 14 and the drain electrode 16 with a gate insulator film interposed between the gate electrode 18 and the graphene film 12.

The graphene film 12 includes a first graphene film 12a, and a second graphene film 12b located on the first graphene film 12a. The gate insulator film 15 is located on the first graphene film 12a with no second graphene film 12b interposed between the gate insulator film 15 and the first graphene film 12a. The source electrode 14 and the drain electrode 16 are disposed on the second graphene film 12b.

In the graphene film 12, the region overlapping with the source electrode 14 is a source region 24, and the region overlapping with the drain electrode 16 is a drain region 26. In the graphene film 12, the region overlapping with the bottom face of the gate electrode 18 is a channel region 28. The region between the source region 24 and the channel region 28 is an access region 23, and the region between the drain region 26 and the channel region 28 is an access region 25. Each of the source region 24 and the drain region 26 includes the first graphene film 12a and the second graphene film 12b. The channel region 28 includes the first graphene film 12a, but includes no second graphene film 12b.

The access region 23 (a first access region) includes a region 23a (a first region) at the source region 24 side (the −X side) and a region 23b (a third region) at the channel region 28 side (the +X side). The access region 25 (a second access region) includes a region 25a (a second region) at the drain region 26 side (the +X side) and a region 25b (a fourth region) at the channel region 28 side (the −X side). Each of the regions 23a and 25a includes the first graphene film 12a and the second graphene film 12b, while each of the regions 23b and 25b includes the first graphene film 12a, but includes no second graphene film 12b. The widths W1 of the source region 24, the drain region 26, and the regions 23a and 25a in the Y direction are greater than the widths W2 of the channel region 28 and the regions 23b and 25b in the Y direction.

The length L24 of the source region 24 in the X direction and the length L26 of the drain region 26 in the X direction are, for example, 3 μm, and the length L28 of the channel region 28 in the X direction is, for example, 0.5 μm. The length L23 of the access region 23 in the X direction and the length L25 of the access region 25 in the X direction are, for example, 2 μm. The length L23b of the region 23b in the X direction and the length L25b of the region 25b in the X direction are, for example, 0.05 μm. In FIG. 1, the lengths of the regions 23b and 25b in the X direction are approximately equal to the thickness of the gate insulator film 15. The width W1 is, for example, 30 μm, and the width W2 is, for example, 10 μm.

The substrate 10 is, for example, a hexagonal Sic (6H-SiC) substrate. The first graphene film 12a is formed of, for example, two atomic layers, and is formed of, for example, five or less atomic layers. The second graphene film 12b is formed of one or more atomic layers, and the total number of atomic layers forming the first graphene film 12a and the second graphene film 12b is, for example, ten or greater.

[Manufacturing Method of the First Embodiment]

Figure 3A:
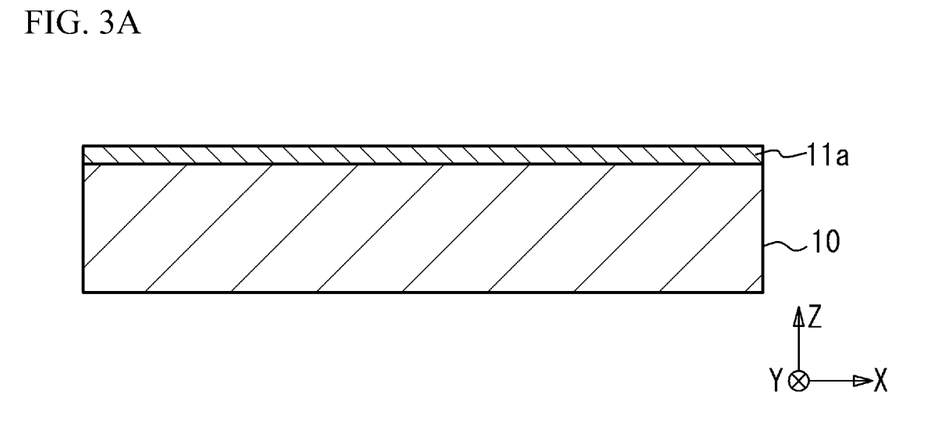
FIG. 3A is a cross-sectional view (No. 1) illustrating a method of manufacturing the semiconductor device in accordance with the first embodiment.

FIG. 3A to FIG. 5C are cross-sectional views illustrating the method of manufacturing the semiconductor device in accordance with the first embodiment. As illustrated in FIG. 3A, a first SiC film 11a is formed on the substrate 10. The first SiC film 11a is, for example, amorphous or polycrystalline, and is formed by sputtering, chemical vapor deposition (CVD), or pulsed laser deposition (PLD). The thickness of the first SiC film 11a is, for example, 2 nm. The first SiC film 11a is disposed on the substrate 10.

Figure 3B:
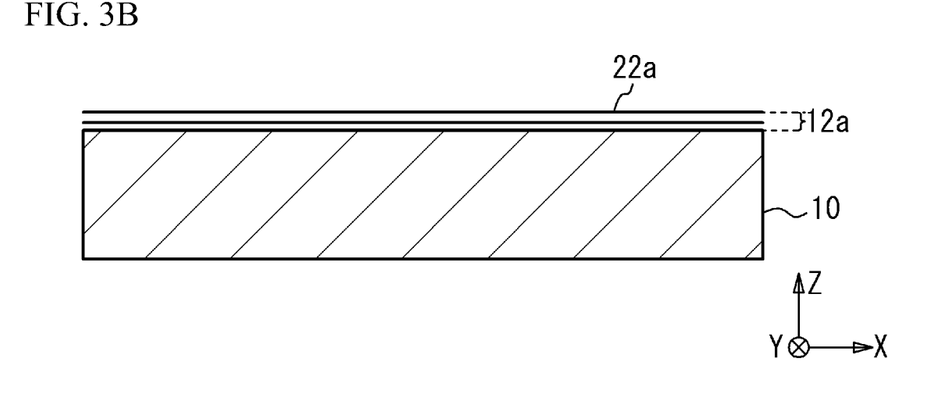
FIG. 3B is a cross-sectional view (No. 2) illustrating the method of manufacturing the semiconductor device in accordance with the first embodiment.

As illustrated in FIG. 3B, the first graphene film 12a having atomic layers 22a of graphene is formed from the first SiC film 11a by heat-treating the first SiC film 11a. The heat treatment is performed in, for example, argon gas atmosphere at a temperature of 1700° C. for 10 minutes. The atmosphere for the heat treatment is at least inert gas atmosphere such as noble gas. The heat treatment temperature is preferably 1300° C. or greater and 1800° C. or less. When the thickness of the first SiC film 11a is 2 nm, the number of the atomic layers 22a of the first graphene film 12a is two. The number of the atomic layers 22a of the first graphene film 12a can be set by adjusting the thickness of the first SiC film 11a as appropriate. The first graphene film 12a is disposed on the substrate 10.

Figure 3C:
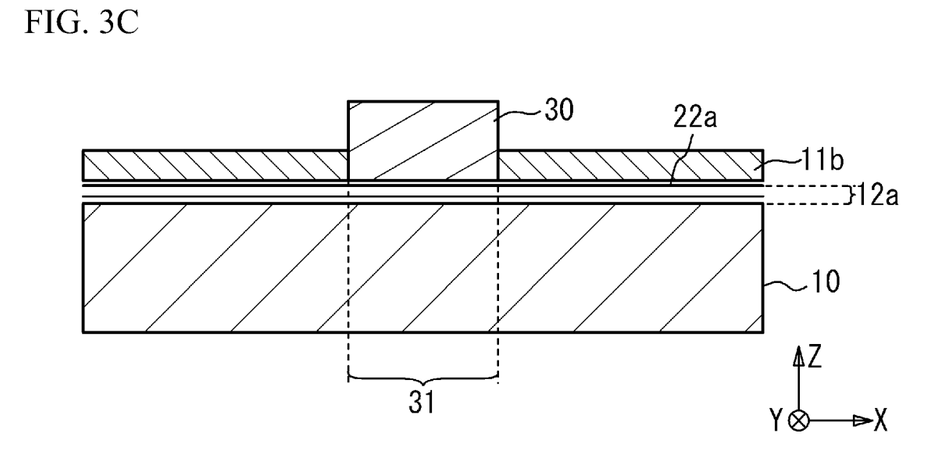
FIG. 3C is a cross-sectional view (No. 3) illustrating the method of manufacturing the semiconductor device in accordance with the first embodiment.

As illustrated in FIG. 3C, a mask layer 30 is formed on the first graphene film 12a in a region 31. The mask layer 30 is formed of, for example, a photoresist. A second SiC film 11b is formed in a part of the region on the first graphene film 12a. The second SiC film 11b is, for example, amorphous or polycrystalline, and is formed by sputtering, CVD, or PLD. The thickness of the second SiC film 11b is, for example, 10 nm. No second SiC film 11b is formed on the mask layer 30. The mask layer 30 is located in the region 31 on the first graphene film 12a, and the second SiC film 11b is located on the first graphene film 12a at both sides of the mask layer 30 in the X direction.

Figure 4A:
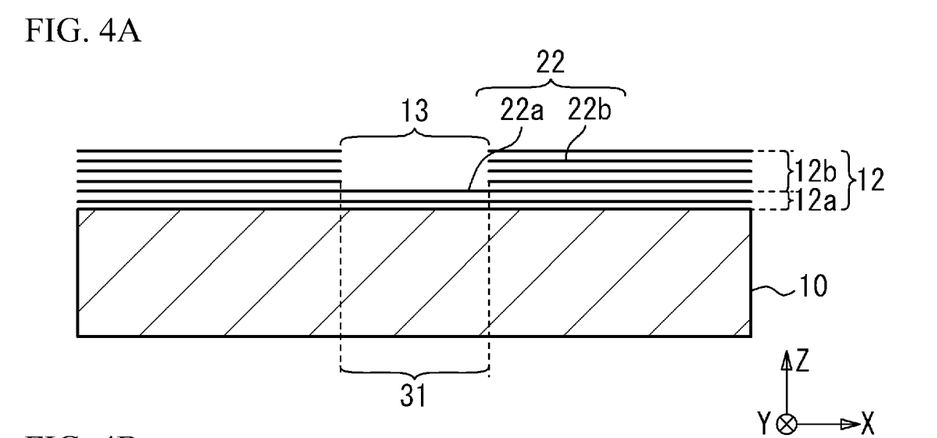
FIG. 4A is a cross-sectional view (No. 4) illustrating the method of manufacturing the semiconductor device in accordance with the first embodiment.

As illustrated in FIG. 4A, the mask layer 30 is removed. Thereafter, the second graphene film 12b having atomic layers 22b of graphene is formed from the second SiC film 11b by heat-treating the second SiC film 11b. The heat treatment conditions are the same as those in FIG. 3A. When the thickness of the second SiC film 11b is 10 nm, the number of the atomic layers 22b of the second graphene film 12b is eight. The first graphene film 12a and the second graphene film 12b form the graphene film 12. In the region 31, the first graphene film 12a is disposed on the substrate 10, and no second graphene film 12b is disposed. In the regions at both sides of the region 31 in the X direction, the first graphene film 12a is disposed on the substrate 10, and the second graphene film 12b is disposed on the first graphene film 12a. Thus, a recess 13 is formed in the graphene film 12 in the region 31.

Figure 4B:
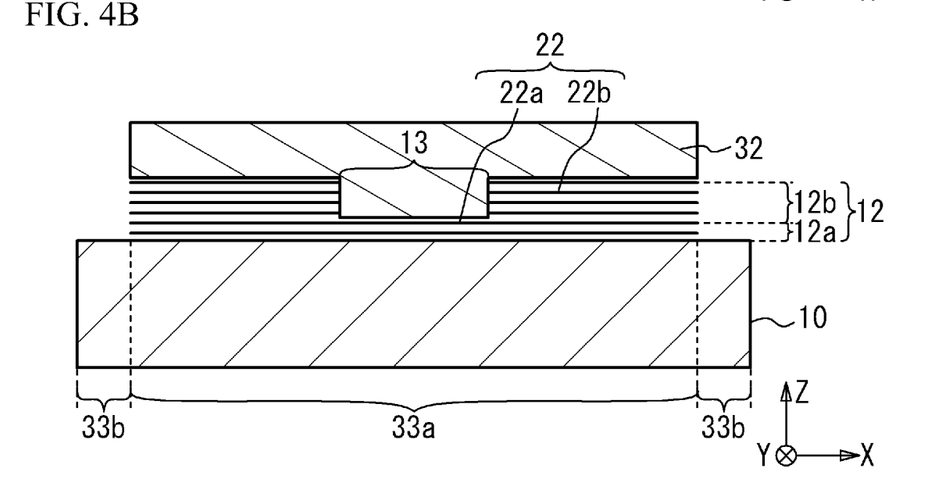
FIG. 4B is a cross-sectional view (No. 5) illustrating the method of manufacturing the semiconductor device in accordance with the first embodiment.

As illustrated in FIG. 4B, a mask layer 32 is formed on the graphene film 12 to be an active region 33a. The mask layer 32 is formed of, for example, a photoresist. The graphene film 12 is removed using the mask layer 32 as a mask. The graphene film 12 is removed using, for example, oxygen plasma treatment. The region where the graphene film 12 is removed becomes an inactive region 33b, and the region where the graphene film 12 remains becomes the active region 33a.

Figure 4C:
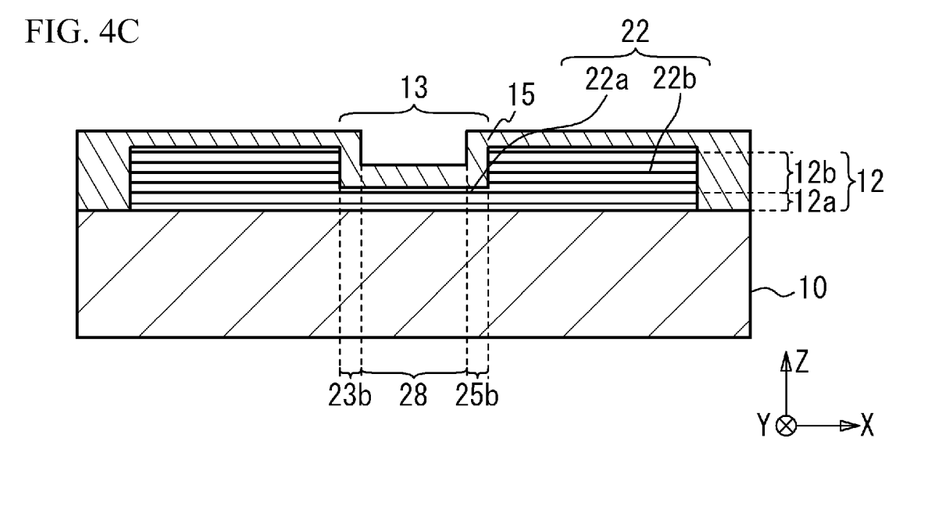
FIG. 4C is a cross-sectional view (No. 6) illustrating the method of manufacturing the semiconductor device in accordance with the first embodiment.

As illustrated in FIG. 4C, the mask layer 32 is removed. Thereafter, the gate insulator film 15 is formed on the graphene film 12. The gate insulator film 15 is, for example, an aluminum oxide film, and is formed by sputtering, CVD, or atomic layer deposition (ALD). The thickness of the gate insulator film 15 is, for example, 30 nm. The gate insulator film 15 may be a silicon oxide film or the like instead of the aluminum oxide film. In the recess 13 of the graphene film 12, the regions corresponding to the side walls of the gate insulator film 15 becomes the regions 23b and 25b, and the region between the regions 23b and 25b becomes the channel region 28.

Figure 5A:
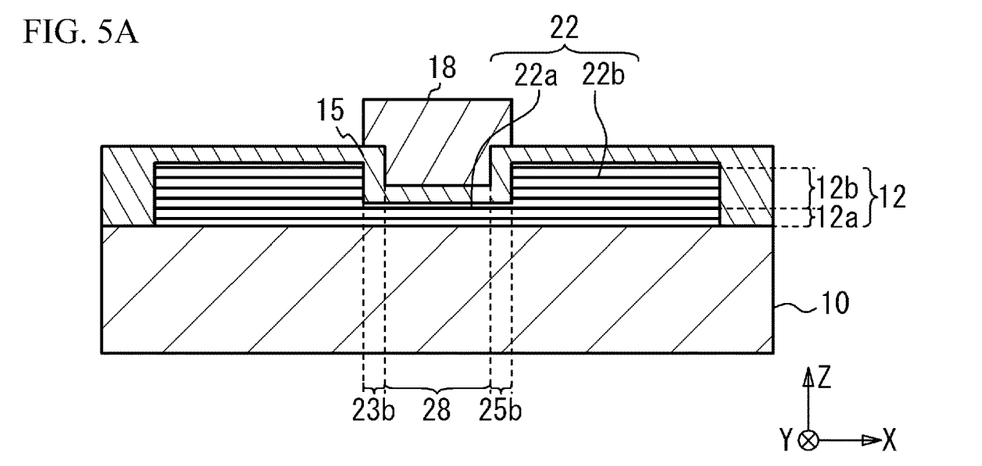
FIG. 5A is a cross-sectional view (No. 7) illustrating the method of manufacturing the semiconductor device in accordance with the first embodiment.

As illustrated in FIG. 5A, the gate electrode 18 is located on the gate insulator film 15. This process forms the gate electrode 18 on the first graphene film 12a in the region where no second graphene film 12b is formed, with the gate insulator film 15 interposed between the gate electrode 18 and the first graphene film 12a. The gate electrode 18 is formed by, for example, vacuum evaporation and liftoff. The gate electrode 18 may be formed by sputtering and etching. The gate electrode 18 is formed of, for example, a nickel film with a thickness of 5 nm and a gold film with a thickness of 50 nm that are stacked in this order from the gate insulator film 15 side. The width of the gate electrode 18 in the X direction is at least equal to or greater than the width of the recess 13 in the X direction.

Figure 5B:
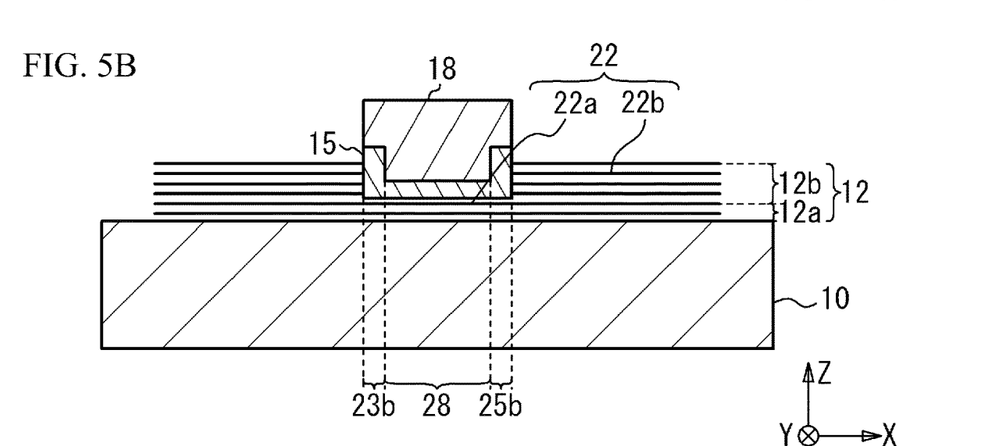
FIG. 5B is a cross-sectional view (No. 8) illustrating the method of manufacturing the semiconductor device in accordance with the first embodiment.

As illustrated in FIG. 5B, the gate insulator film 15 is removed using the gate electrode 18 as a mask. When the gate insulator film 15 is an aluminum oxide film, an alkali solution such as developer is used to etch the gate insulator film 15.

Figure 5C:
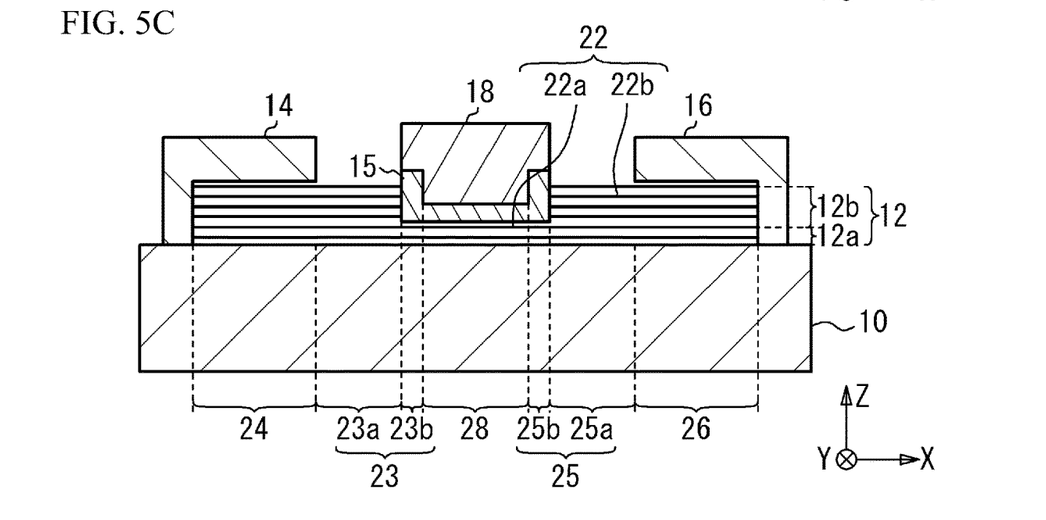
FIG. 5C is a cross-sectional view (No. 9) illustrating the method of manufacturing the semiconductor device in accordance with the first embodiment.

As illustrated in FIG. 5C, the source electrode 14 and the drain electrode 16 are formed on the second graphene film 12b at both sides of the gate electrode 18, respectively. The source electrode 14 and the drain electrode 16 are formed by, for example, vacuum evaporation and liftoff. The source electrode 14 and the drain electrode 16 may be formed by sputtering and etching. Each of the source electrode 14 and the drain electrode 16 is formed of, for example, a nickel film with a thickness of 5 nm and a gold film with a thickness of 50 nm that are stacked in this order from the graphene film 12 side. The FET in accordance with the first embodiment is manufactured through the above process.

As illustrated in FIG. 3A to FIG. 4A, by adjusting the thickness of the first SiC film 11a and the thickness of the second SiC film 11b as appropriate, the number of the atomic layers 22 of the first graphene film 12a and the number of the atomic layers 22 of the second graphene film 12b can be set as desired.

Figure 6:
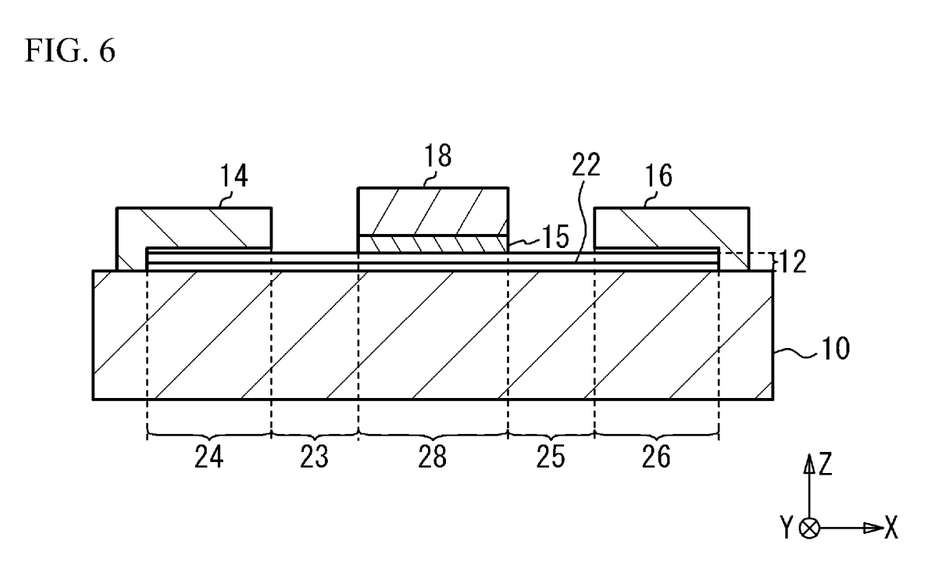
FIG. 6 is a cross-sectional view of a semiconductor device in accordance with a first comparative example.

FIG. 6 is a cross-sectional view of a semiconductor device in accordance with a first comparative example. As illustrated in FIG. 6, in the first comparative example, the number of the atomic layers 22 of the graphene film 12 is the same all in the source region 24, the drain region 26, the channel region 28, and the access regions 23 and 25. Other structures are the same as those of the first embodiment.

The band structure of the conduction band of graphene in k-space and the band structure of the valence band of graphene in k-space have conic shapes, and the tip of the cone-shaped conduction band is in contact with the tip of the cone-shaped valence band at the K point. The point at which the tip of the conduction band is in contact with the tip of the valence band is called a Dirac point (or a charge neutral point).

Figure 7:
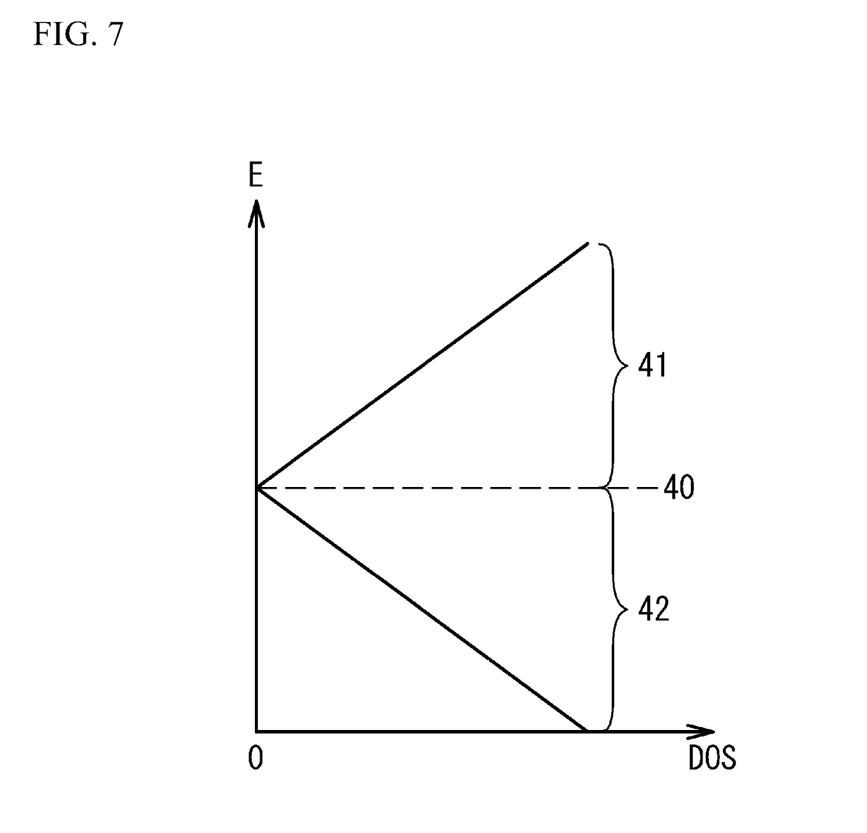
FIG. 7 illustrates the energy and the density of states of carriers when a graphene film is formed of a single atomic layer of graphene.

FIG. 7 illustrates the energy and the density of states (DOS) of carriers when a graphene film is formed of a single atomic layer of graphene. As illustrated in FIG. 7, at a Dirac point 40, the DOS of carriers (electrons and holes) is approximately zero. A range 41 of the energy E higher than the Dirac point 40 corresponds to the conduction band, and the DOS is the density of states of electrons and linearly increases with respect to the energy E. A range 42 of the energy E lower than the Dirac point 40 corresponds to the valence band, and the DOS is the density of states of holes and linearly increases with respect to the energy E. Such a cone-shaped band structure is a semiconductor-like band structure.

When no voltage is applied to graphene, the Fermi level is at the Dirac point 40. Thus, the DOS of carriers is approximately zero, and there are almost no carriers contributing to conduction. When an electric field is applied to graphene in the vertical direction (the Z direction in FIG. 1), the Fermi level becomes out of the Dirac point 40, the density of states of carriers becomes nonzero, and carriers contributing conduction are generated.

To improve the transconductance gm characteristics of the FET of the first comparative example, the number of the atomic layers 22 of the graphene film 12 is preferably small, and for example, the number of the atomic layers 22 is two or less. In the source region 24, the drain region 26, and the access regions 23 and 25, an electric field is little applied to the graphene film 12 in the Z direction. Therefore, the Fermi level in the graphene film 12 is at the Dirac point 40, and the density of states of carriers contributing conductance becomes approximately zero. Therefore, the contact resistance between the source electrode 14 and the source region 24 and the contact resistance between the drain electrode 16 and the drain region 26 increase. In addition, the resistances of the access regions 23 and 25 increase. Thus, the parasitic resistance between the source electrode 14 and the channel region 28 and the parasitic resistance between the drain electrode 16 and the channel region 28 increase.

The cutoff frequency ft of the FET using graphene is lower than the ideal ft. According to an exemplary simulation by the inventors, the cutoff frequency can be increased by a factor of approximately ten times by bringing the parasitic resistance close to zero.

Non-Patent Document 1 describes that a graphene film having a single atomic layer has a simple band structure, but as the number of atomic layers of the graphene film increases, the band structure becomes complicating even near the Dirac point, and becomes a semimetal-like band structure.

Figure 8:
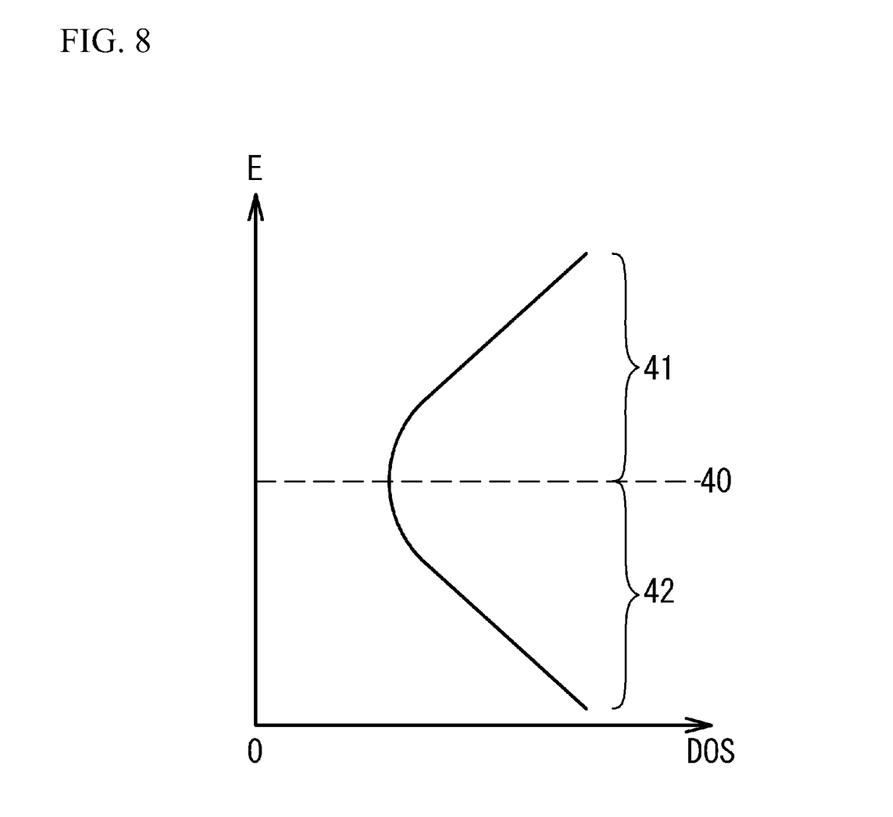
FIG. 8 illustrates the energy and the density of states of carries when the graphene film is formed of a plurality of atomic layers of graphene.

FIG. 8 illustrates the energy and the density of states of carriers when a graphene film is formed of a plurality of atomic layers of graphene. As illustrated in FIG. 8, the DOS does not become zero even at the Dirac point 40 where the electric charge becomes neutral. Such a band structure is a semimetal-like band structure. Thus, the electric field is not applied to the graphene film 12 in the vertical direction, and carriers contributing to conduction exist even when the Fermi level is near the Dirac point 40.

[Experiment]

The inventor measured the contact resistance between the ohmic electrode and the graphene film 12 and the sheet resistance of the graphene film 12 using the transmission line method (TLM).

Figure 9:
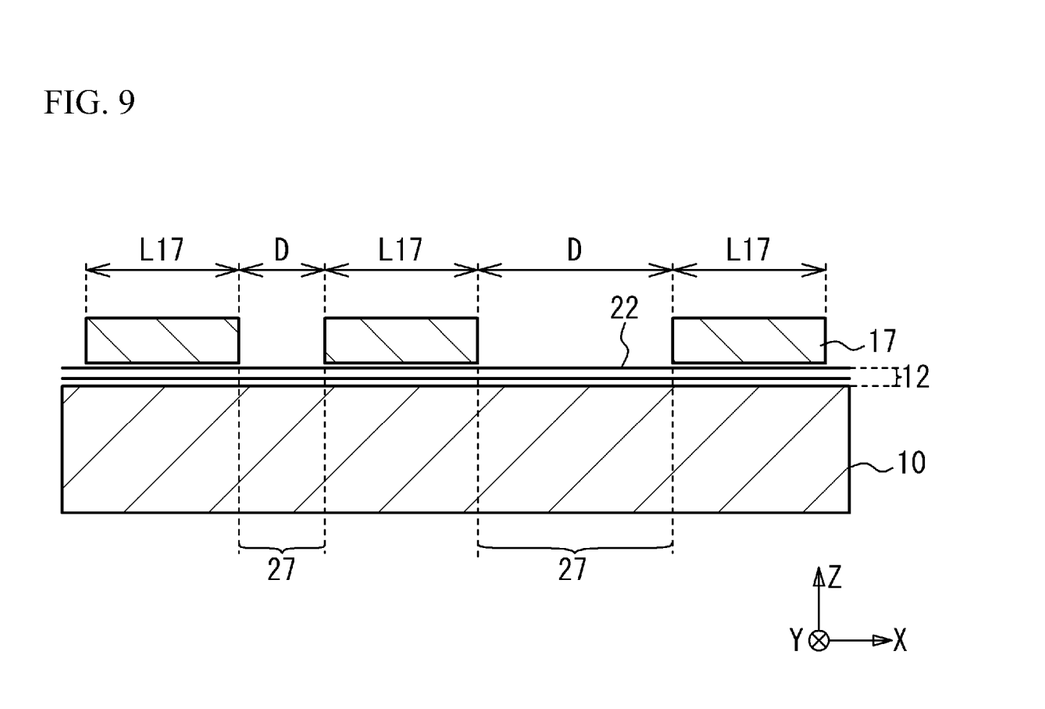
FIG. 9 is a cross-sectional view of a pattern used in an experiment.

FIG. 9 is a cross-sectional view of a pattern used in the experiment. As illustrated in FIG. 9, the graphene film 12 is formed on the 6H-SiC substrate 10. Ohmic electrodes 17 corresponding to the source electrode and the drain electrode are formed on the graphene film 12. The graphene film 12 between the ohmic electrodes 17 is a region 27. The ohmic electrode 17 is formed of, for example, a nickel film with a thickness of 5 nm and a gold film with a thickness of 50 nm that are stacked in this order from the graphene film 12 side. The length L17 of the ohmic electrode 17 in the X direction is 5 μm. The width (the channel width) of the graphene film 12 in the Y direction is 20 μm. The resistance value between the ohmic electrodes 17 was measured for different distances D between the ohmic electrodes 17.

The number of the atomic layers 22 of the graphene film 12 in each of samples A to C is as follows.

Sample A: one atomic layer

Sample B: two atomic layers

Sample C: approximately ten atomic layers

Figure 10A:
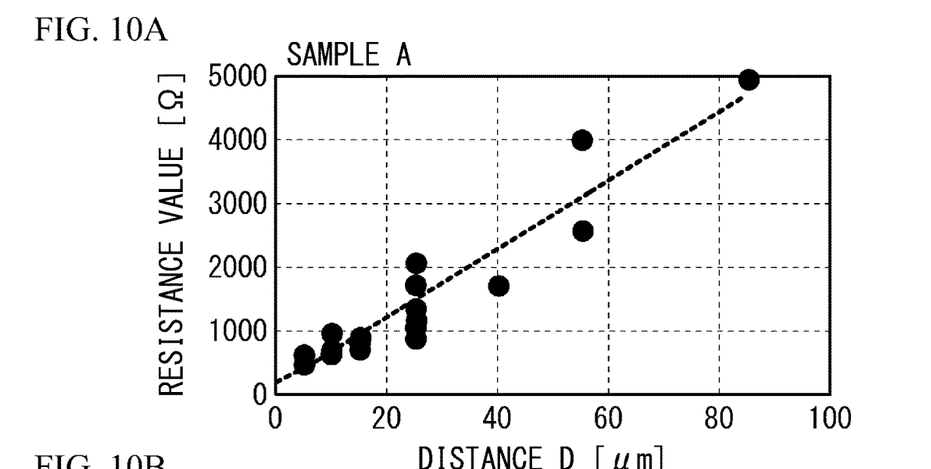
FIG. 10A is a graph of a resistance value versus a distance D in a sample A.
Figure 10B:
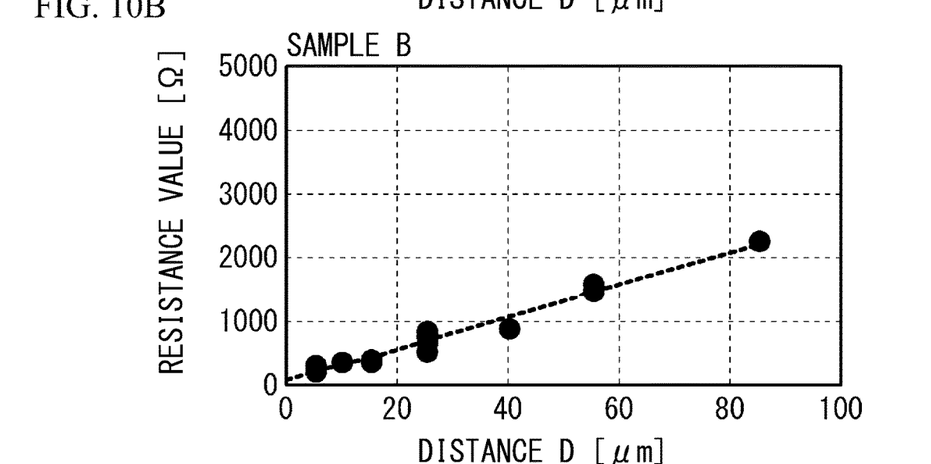
FIG. 10B is a graph of a resistance value versus a distance D in a sample B.
Figure 10C:
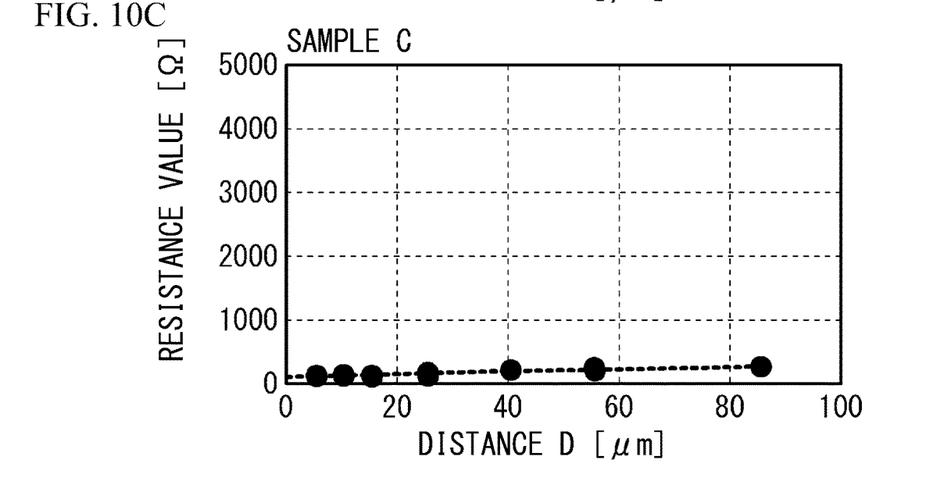
FIG. 10C is a graph of a resistance value versus a distance D in a sample C.

FIG. 10A to FIG. 10C are graphs of a resistance value versus the distance D in the samples A, B, and C, respectively. Dots in the graph indicate measured values, and the dotted line is a straight line approximated from the measured values using the least-square method. As presented in FIG. 10A and FIG. 10B, the slope of the approximated line of the resistance values with respect to the distance D in the sample B is less than that in the sample A. As presented in FIG. 10B and FIG. 10C, the slope of the approximated line of the resistance values with respect to the distance D in the sample C is much less than that in the sample B. The slope of the approximated line of the resistance values with respect to the distance D is proportional to the sheet resistance of the graphene film 12. As the number of the atomic layers 22 increases in the order of the samples A, B, and C, the sheet resistance of the graphene film 12 decreases. The resistance value at the distance D=0 in the dotted line is proportional to the contact resistance between the ohmic electrode 17 and the graphene film 12.

Table 1 lists the sheet resistance and the contact resistance in each of the samples A, B, and C calculated from FIG. 10A to FIG. 10C.

TABLE 1

| | Sample | | |
|---|---|---|---|
| | A | B | C |
| Sheet resistance [Ω/□] | 1072 | 498 | 38 |
| Contact resistance [×10⁻⁵ Ω · cm²] | 14 | 10 | 10 |

As presented in Table 1, the sheet resistance of the sample B is approximately ½ of that of the sample A. The sheet resistance of the sample C is approximately 1/30 of that of the sample A. If the band structure is not taken into consideration, it is considered that the sheet resistance is inversely proportional to the number of the atomic layers 22 of the graphene film 12. The reason why the sheet resistance in the sample C having approximately ten atomic layers 22 is approximately 1/30 of that in the sample A having one atomic layer as presented in Table 1 is considered because the band structure in the approximately ten atomic layers is a semimetal-like band structure illustrated in FIG. 8.

Although the measurement accuracy of the contact resistance is poor, the contact resistance of the sample B having two atomic layers and the contact resistance of the sample C having approximately ten atomic layers are less than at least that of the sample A having one atomic layer. As described above, as the number of the atomic layers 22 of the graphene film 12 increases, the sheet resistance and the contact resistance decrease. This is considered because as the number of the atomic layers 22 increases, more semimetal-like band structure is achieved.

In the first embodiment, the number of the atomic layers 22 of the graphene film 12 in each of the source region 24 where the source electrode 14 is located and the drain region 26 where the drain electrode 16 is located is greater than the number of the atomic layers 22 of the graphene film 12 in the channel region 28 where the gate electrode 18 is located. Since the number of the atomic layers 22 in the channel region 28 is small, the characteristics including transconductance are improved. Since the number of the atomic layers 22 in the source region 24 and the drain region 26 is large, the contact resistance between the source electrode 14 and the graphene film 12 and the contact resistance between the drain electrode 16 and the graphene film 12 are reduced, and the parasitic resistance can be thereby reduced. Thus, the characteristics of the graphene FET are improved.

The number of the atomic layers 22 in at least the region 23a (a first region), which is at the source region 24 side, of the access region 23 (a first access region) between the source region 24 and the channel region 28 is greater than the number of the atomic layers 22 in the channel region 28. In addition, the number of the atomic layer 22 in at least the region 25a (a second region), which is at the drain region 26 side, of the access region 25 (a second access region) between the drain region 26 and the channel region 28 is greater than the number of the atomic layers 22 in the channel region 28. This configuration reduces the sheet resistances of the access regions 23 and 25, thereby reducing the parasitic resistance. Therefore, the characteristics of the graphene FET can be improved. The lengths L23b and L25b of the regions 23b and 25b are preferably equal to or less than the lengths L23a and L25a of the regions 23a and 25a in the X direction, more preferably equal to or less than ⅕ of the lengths L23a and L25a. This configuration increases the areas of the regions 23a and 25a where the number of the atomic layers 22 is large in the access regions 23 and 25, respectively, therefore, further reducing the parasitic resistance. It is not always necessary to provide the regions 23b and 25b.

The number of the atomic layers 22 in each of the source region 24, the drain region 26, and the regions 23a and 25a is preferably ten or greater, and the number of the atomic layers 22 in the channel region 28 is preferably two or less. The graphene film 12 in each of the source region 24, the drain region 26, and the regions 23a and 25a has ten or more atomic layers 22, therefore having a semimetal-like band structure illustrated in FIG. 8. Thus, the parasitic resistance is further reduced. The first graphene film 12a in the channel region 28 has two or less atomic layers 22, therefore having a cone-shaped semiconductor-like band structure illustrated in FIG. 7. Therefore, the transconductance can be increased. Thus, the characteristics of the graphene FET can be further improved. The number of the atomic layers 22 in each of the source region 24, the drain region 26, and the regions 23a and 25a is more preferably 12 or greater. To reduce manufacturing steps, the number of the atomic layers 22 in each of the source region 24, the drain region 26, and the regions 23a and 25a is preferably 20 or less. The number of the atomic layers 22 in the channel region 28 is more preferably one or less. The number of the atomic layers 22 in the channel region 28 is preferably greater than zero.

To increase the transconductance of the FET, the number of the atomic layers 22a of the first graphene film 12a is preferably two or less, more preferably one or less. To reduce the contact resistance, the number of the atomic layers 22b of the second graphene film 12b is preferably two or greater, more preferably five or greater. This configuration reduces the parasitic resistance.

The widths W1 of the source region 24 and the drain region 26 in the Y direction (the direction (a first direction) perpendicular to the X direction (a second direction) in which the source electrode 14 and the drain electrode 16 are arranged) are greater than the width W2 of the channel region 28 in the Y direction. This structure decreases the resistance between the source electrode 14 and the graphene film 12 and the resistance between the drain electrode 16 and the graphene film 12. In addition, the widths W1 of the regions 23a and 25a in the Y direction are adjusted to be greater than the width W2. This configuration reduces the resistances of the access regions 23 and 25. Therefore, the parasitic resistance decreases, and thereby, the FET characteristics are further improved. The width W1 is preferably equal to or greater than 1.5 times the width W2, more preferably equal to or greater than 2 times the width W2. To reduce the size, the width W1 is preferably equal to or less than 10 times the width W2.

Although the embodiments of the present invention have been described in detail, it is to be understood that the various change, substitutions, and alterations could be made hereto without departing from the spirit and scope of the invention.

What is claimed is:

1. A semiconductor device comprising:
    a graphene film disposed on a substrate and formed of atomic layers of graphene that are stacked;
    a source electrode and a drain electrode disposed on the graphene film; and
    a gate electrode disposed on the graphene film between the source electrode and the drain electrode with a gate insulator film interposed between the gate electrode and the graphene film,
    wherein a first number of the atomic layers of the graphene film in a source region where the source electrode is located and a drain region where the drain electrode is located is greater than a second number of the atomic layers of the graphene film in a channel region where the gate electrode is located, wherein a third number of the atomic layers in at least a first region, which is at the source region side, of a first access region between the source region and the channel region is greater than the second number of the atomic layers in the channel region, and wherein a fourth number of the atomic layers in at least a second region, which is at the drain region side, of a second access region between the drain region and the channel region is greater than the second number of the atomic layers in the channel region.

2. The semiconductor device according to claim 1, wherein the first number of the atomic layers in the source region and the drain region is five or greater layers, and the second number of the atomic layers in the channel region is two or less layers.

3. The semiconductor device according to claim 1, wherein a width of each of the source region and the drain region in a first direction perpendicular to a second direction in which the source electrode and the drain electrode are arranged is greater than a width of the channel region in the first direction.

4. The semiconductor device according to claim 1, wherein the first number of the atomic layers in the source region and the drain region is ten or greater layers, and the second number of the atomic layers in the channel region is two or less layers.

5. The semiconductor device according to claim 4, wherein the first number of the atomic layers in the source region and the drain region is 20 or less layers.

6. The semiconductor device according to claim 1, wherein the third number of the atomic layers in the first region is ten or greater layers, and the fourth number of the atomic layers in the second region is ten or greater layers.

7. The semiconductor device according to claim 6, wherein a fifth number of the atomic layers in a third region, which is a region other than the first region in the first access region, is less than the third number of the atomic layers in the first region, and a sixth number of the atomic layers in a fourth region, which is a region other than the second region in the second access region, is less than the fourth number of the atomic layers in the second region.

8. The semiconductor device according to claim 7, wherein a width of the third region in a direction from the source region to the drain region is less than a width of the first region in the direction from the source region to the drain region, and a width of the fourth region in the direction from the source region to the drain region is less than a width of the second region in the direction from the source region to the drain region.

* * * * *